United States Patent
Jang et al.

[11] Patent Number: 5,817,567
[45] Date of Patent: Oct. 6, 1998

[54] SHALLOW TRENCH ISOLATION METHOD

[75] Inventors: Syun-Ming Jang, Hsin-Chu; Ying-Ho Chen, Taipei; Chen-Hua Yu, Hsin-Chu, all of Taiwan

[73] Assignee: Taiwan Semiconductor Manufacturing Company Ltd., Hsin-Chu, Taiwan

[21] Appl. No.: 826,710

[22] Filed: Apr. 7, 1997

[51] Int. Cl.$^6$ .................................................. H01L 21/76
[52] U.S. Cl. .................... 438/427; 438/424; 438/435; 438/437; 438/642; 148/DIG. 50
[58] Field of Search .................................... 438/424, 427, 438/435, 437, 692

[56] References Cited

U.S. PATENT DOCUMENTS

| | | | |
|---|---|---|---|
| 5,275,965 | 1/1994 | Manning | 437/67 |
| 5,312,512 | 5/1994 | Allman et al. | 156/636 |
| 5,350,486 | 9/1994 | Huang | 156/633 |
| 5,362,669 | 11/1994 | Boyd et al. | 148/DIG. 50 |
| 5,441,094 | 8/1995 | Pasch | 438/427 |
| 5,494,857 | 2/1996 | Cooperman et al. | 438/427 |
| 5,665,202 | 9/1997 | Subramanian et al. | 438/427 |

Primary Examiner—Trung Dang
Attorney, Agent, or Firm—George O. Saile; Stephen B. Ackerman

[57] ABSTRACT

An improved method for implementing shallow trench isolation in integrated circuits is described. The method begins with the formation of trenches, through patterning and etching. These trenches are then filled with a conformal layer of silicon oxide. This is followed by overcoating with a layer of a hard material such as silicon nitride or boron nitride. Next, chemical-mechanical polishing is used to remove the hard layer everywhere except where it has filled the depressions that overlie the trenches. Then, a non-selective etch is used to remove the remaining hard layer material as well as some of the silicon oxide, so that a planar surface is maintained. Finally, chemical-mechanical polishing is used a second time to remove excess silicon oxide from above the trenches' surface.

16 Claims, 2 Drawing Sheets

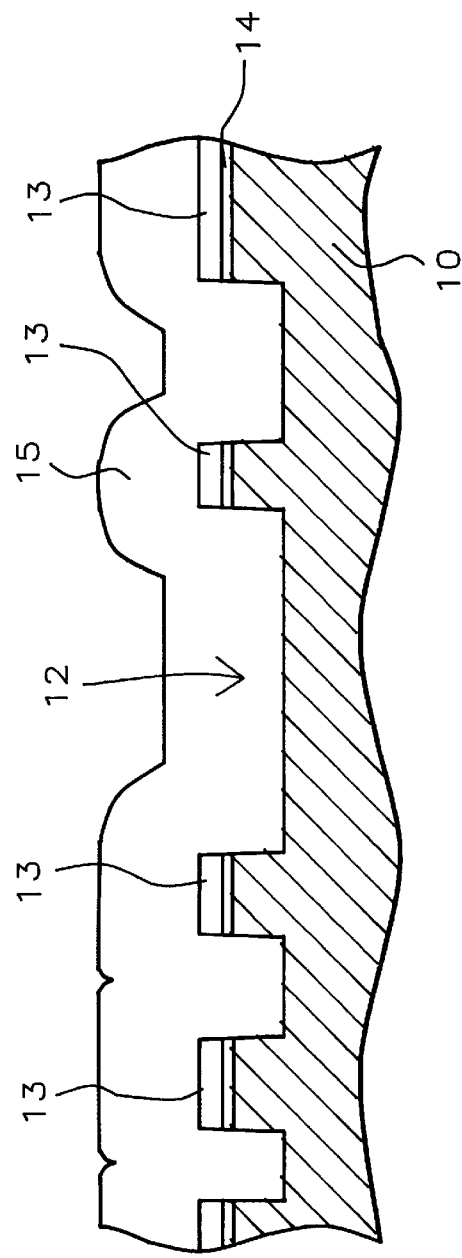
FIG. 1 – Prior Art
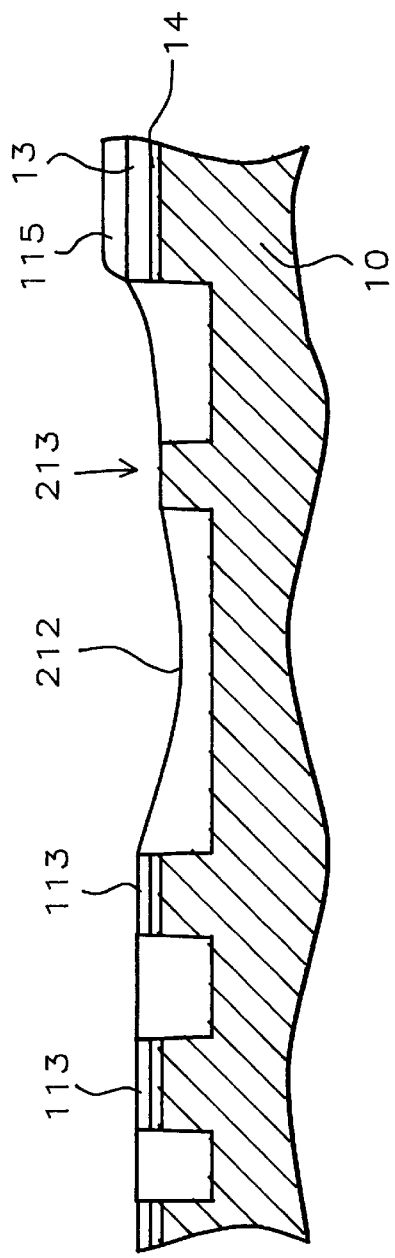
FIG. 2 – Prior Art

SHALLOW TRENCH ISOLATION METHOD

BACKGROUND OF THE INVENTION (1) Field of the Invention

The invention relates to the general field of shallow trench and refill isolation in integrated circuits, more particularly to integrating silicon nitride and silicon oxide processes with chemical mechanical polishing.

(2) Description of the Prior Art

In recent years, shallow trench isolation (STI) has become increasingly popular as a means for electrically isolating devices from one another in integrated circuits. Instead of forming insulating regions around devices through local oxidation of silicon (LOCOS) trenches are etched into the silicon and then filled with insulating material (usually silicon oxide). An example of this may be seen in FIG. 1 which is a cross-section of partially completed integrated circuit 10 in whose upper surface trench 12 has been etched, using patterned layer 13 of silicon nitride as a mask. A thin layer of pad oxide 14 underlies layer 13.

Following formation of trench 12, silicon oxide layer 15 was deposited over the entire surface. As seen, layer 15 follows the contours of the underlying surface fairly closely. Ideally, the next step in the STI process would be to planarize the surface by removing layer 15 everywhere except inside the trenches. This is best accomplished by means of chemical mechanical polishing (CMP) which tends to remove material along a planar etch front.

Unfortunately, even CMP has been found to be less than totally satisfactory in this situation. In particular, it is susceptible to dishing which causes oxide thinning in a wide trench. This is illustrated in FIG. 2 and comes about because of a tendency for CMP to be faster over narrow lines or wide trenches—a consequence of local distortion that occurs in the polishing pad. Thus, as illustrated schematically, a portion of the original layer 15 (marked as 115) has yet to be removed while in other areas it has not only been removed but parts of original layer 13 (marked as 113) have been partially removed as well. In an extreme case (marked as 213) original layer 13 has been removed completely. Furthermore, the top surface of filled trench 12 (marked as 212) is seen to be concave, not planar.

The present invention provides a method for filling and planarizing shallow trenches without encountering the above problems.

Several patents in the prior art describe processes that are related to that of the present invention but none that we are aware of is close enough to be considered equivalent. Thus, Manning (U.S. Pat. No. 5,275,965 Jan 1994) shows a method of trench isolation that uses gated sidewalls. Allman et al. (U.S. Pat. No. 5,312,512 May 1994) describe a planarization process spin-on glass deposition, followed by etchback and CMP. Huang (U.S. Pat. No. 5,350,486 Sep 1994) uses selective etching to form a stop layer, 'selective' meaning 'confined to certain areas' as opposed to chemically selective.

SUMMARY OF THE INVENTION

It has been an object of the present invention to provide a method for implementing shallow trench isolation in integrated circuits.

Another object of the present invention has been that said method for implementing shallow trench isolation in integrated circuits be free from problems of dishing.

Yet another object of the present invention has been to provide a fully planar surface for an integrated circuit at the conclusion of a shallow trench isolation process.

These objects have been achieved by first forming trenches through patterning and etching and then filling them with a conformal layer of silicon oxide. This is followed by overcoating with a layer of a hard material such as silicon nitride or boron nitride. Next, chemical-mechanical polishing is used to remove the hard layer everywhere except where it has filled the depressions that overlie the trenches. Then, a non-selective etch is used to remove the remaining hard layer material as well as some of the silicon oxide, so that a planar surface is maintained. Finally, chemical-mechanical polishing is used a second time to remove excess silicon oxide from above the trenches' surface.

BRIEF DESCRIPTION OF THE DRAWINGS

FIGS. 1 and 2 illustrate the method used to implement shallow trench isolation in the prior art.

DESCRIPTION OF THE PREFERRED EMBODIMENTS

Figure 3:
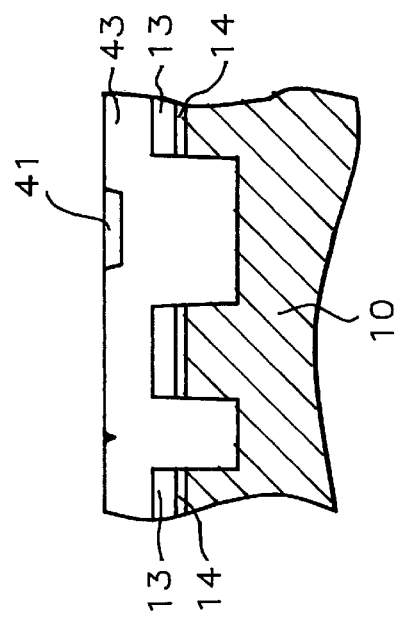
FIG. 3 shows a trench, filled with silicon oxide and then overcoated with a hard layer.

The method of the present invention starts off with the same initial steps as already discussed and illustrated in FIG. 1, namely the provision of partially formed integrated circuit 10 on whose upper surface a layer of pad oxide 14 (between about 100 and 200 Angstroms thick) has been formed and then overcoated with a layer of silicon nitride 13. The latter was deposited by low pressure chemical vapor deposition (LPCVD) to a thickness between about 1,000 and 2,000 Angstroms. This was followed by the patterning and etching of the silicon nitride and pad oxide layers so as to expose those parts of the surface of 10 in which the trench is to be formed. Typically the exposed areas are rectangles measuring between about 3,000 and about 5,000 Angstroms. Using silicon nitride layer 13 as a mask, these exposed areas were etched to a depth of between about 0.3 and 0.5 microns, thereby forming the shallow trenches. Finally (as far as following the prior art is concerned) conformal layer of silicon oxide 15 was deposited over the surface to a thickness between about 0.6 and 0.8 microns by means of atmospheric pressure CVD (APCVD) ozone tetraethyl orthosilicate ($O_3$ TEOS) or sub-atmospheric CVD (SACVD) $O_3$TEOS or high density plasma CVD (HDPCVD) silane oxide.

Referring now to FIG. 3, in a major departure from prior art practices, layer 31 of a hard material was then deposited over oxide layer 15 to a thickness between about 0.1 and 0.4 microns. Examples of suitable hard materials include silicon nitride, and boron nitride. Note that depressions such as 32 have been formed in the upper surface of 31 wherever it overlies the original trenches.

Figure 4:
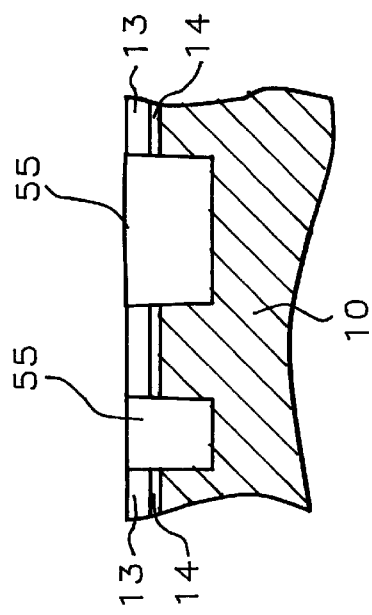
FIG. 4 shows the result of using CMP to remove all of the hard layer except what remains above the trenches.

The next step in our process is to use CMP to planarize layers 15 and 31. However, this planarization step is not carried all the way until the upper surface of layer 13 is reached. Instead, CMP is stopped as soon as layer 31 has been removed everywhere except in depressions such as 32. The filled depression in FIG. 4 has been marked as 41.

Figure 5:
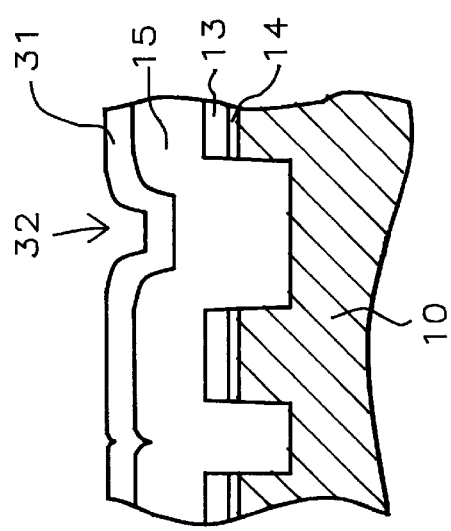
FIG. 5 shows the result of using a non-selective etch to remove hard layer that remains above the trenches.

Following the removal of 31 (except in the depressions) the structure is subjected to etching by a non-selective etchant (one that does not distinguish between layers 41 and 45) so that the planar surface achieved in the previous CMP step is maintained. For the silicon nitride/silicon oxide system, an example of a non-selective etchant is trifluoro methane with carbon tetrafluoride and argon, used at a temperature between about 50° and 100 ° C. For the example 2/silicon oxide system, an example of a nonselective etchant is also trifluoro methane with carbon tetrafluoride and argon, used at a temperature between about 50° and 100° C. This etch step is used for as long as it takes to remove all of layer 41 (and any other remnants of original layer 31). Once this has been is completed, the structure has the appearance seen in FIG. 5.

Figure 6:
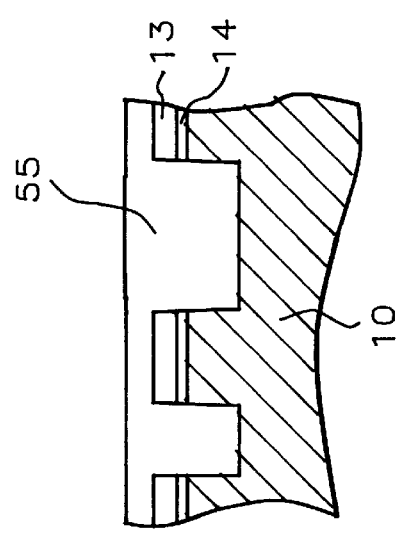
FIG. 6 shows the result of using CMP to remove silicon oxide down to the level of the original surface.

The final step in the method of the present invention is a second CMP step to remove the remains of original layer 15 (shown as 55 in FIG. 5) down to the level of layer 13. The structure at the completion of the process then has the appearance illustrated in FIG. 6.

While the invention has been particularly shown and described with reference to the preferred embodiments thereof, it will be understood by those skilled in the art that various changes in form and details may be made without departing from the spirit and scope of the invention.

What is claimed is:

1. A method for implementing shallow trench isolation in an integrated circuit, comprising the sequential steps of:

providing a partially formed integrated circuit having a first upper surface;

forming a layer of pad oxide on said first upper surface;

depositng a layer of silicon nitride on said pad oxide layer;

patterning and etching the silicon nitride and pad oxide layers so as to expose said first upper surface in selected areas;

etching the selected areas to a depth whereby shallow trenches are formed;

depositing a conformal layer of silicon oxide over the integrated circuit thereby forming a second upper surface that contours the first upper surface including forming depressions above said shallow trenches;

depositing a layer of a hard material onto said second upper surface;

by means of chemical-mechanical polishing, planarizing the second upper surface by removing material from said second upper surface until the hard material has been removed everywhere except in said depressions;

etching the second surface, including the hard layer in the depressions, with a non-selective etchant until all hard material has been removed; and by means of chemical-mechanical polishing, removing material from the second upper surface down to the level of said first upper surface.

2. The method of claim 1 wherein the thickness of said layer of pad oxide is between about 100 and 200 Angstroms.

3. The method of claim 1 wherein the thickness of said layer of silicon nitride is between about 1,000 and 2,000 Angstroms.

4. The method of claim 1 wherein said layer of silicon nitride is deposited by means of LPCVD.

5. The method of claim 1 wherein said selected areas comprise rectangles measuring between about 3,000 and about 5,000 Angstroms.

6. The method of claim 1 wherein said depth is between about 0.3 and 0.5 microns.

7. The method of claim 1 wherein said conformal layer of silicon oxide is deposited to a thickness between about 0.6 and 0.8 microns.

8. The method of claim 1 wherein depositing said conformal layer of silicon oxide further comprises APCVD $O_3$ TEOS or SACVD $O_3$ TEOS or HDPCVD silane oxide.

9. The method of claim 1 wherein the hard material is silicon nitride.

10. The method of claim 9 wherein the silicon nitride is deposited to a thickness between about 0.1 and 0.4 microns.

11. The method of claim 9 wherein the non-selective etchant is trifluoro methane with carbon tetrafluoride and argon.

12. The method of claim 11 wherein etching is performed at a temperature between about 50° and 100° C.

13. The method of claim 1 wherein the hard material is boron nitride.

14. The method of claim 13 wherein the boron nitride is deposited to a thickness between about 0.1 and 0.4 microns.

15. The method of claim 13 wherein the non-selective etchant is trifluoro methane with carbon tetrafluoride and argon.

16. The method of claim 15 wherein etching is performed at a temperature between about 50° and 100° C.

* * * * *